(12) United States Patent
Roberts et al.

(10) Patent No.: US 10,784,656 B2
(45) Date of Patent: Sep. 22, 2020

(54) POWER DISTRIBUTION RACK ASSEMBLY

(71) Applicant: GE Aviation Systems Limited, Cheltenham, Gloucestershire (GB)

(72) Inventors: David K. Roberts, Pershore (GB); Christopher Andrew Leivers, Stroud (GB); John Oliver Collins, Cheltenham (GB)

(73) Assignee: GE Aviation Systems Limited, Gloucestershire (GB)

( * ) Notice: Subject to any disclaimer, the term of this patent is extended or adjusted under 35 U.S.C. 154(b) by 21 days.

(21) Appl. No.: 15/971,057

(22) Filed: May 4, 2018

(65) Prior Publication Data

US 2018/0358785 A1    Dec. 13, 2018

(30) Foreign Application Priority Data

Jun. 12, 2017  (GB) .................................. 1709313.9

(51) Int. Cl.
| | | |
|---|---|---|
| *H02B 1/01* | (2006.01) | |
| *H05K 7/14* | (2006.01) | |
| *H02G 5/02* | (2006.01) | |
| *H02B 15/00* | (2006.01) | |

(52) U.S. Cl.
CPC ............ *H02B 1/011* (2013.01); *H02G 5/025* (2013.01); *H05K 7/1412* (2013.01); *H05K 7/1422* (2013.01); *H05K 7/1457* (2013.01); *B64D 2221/00* (2013.01); *H02B 15/00* (2013.01)

(58) Field of Classification Search
CPC .. B64D 2221/00; H02G 5/025; H05K 7/1412; H05K 7/1422; H05K 7/1457; H05K 5/0021; H05K 5/0247; H02B 1/21; H02B 1/20; H02B 15/00; H02B 1/011
See application file for complete search history.

(56) References Cited

U.S. PATENT DOCUMENTS

| | | | |
|---|---|---|---|
| 4,164,362 A | * | 8/1979 | Cobaugh .............. H01R 13/514 |
| | | | 439/64 |
| 4,862,326 A | | 8/1989 | Blomstedt et al. |
| 5,216,579 A | | 6/1993 | Basara et al. |
| 6,504,730 B1 | | 1/2003 | Cooney et al. |
| 6,551,138 B2 | | 4/2003 | Ruque |
| 6,608,406 B2 | | 8/2003 | Bersiek |

(Continued)

FOREIGN PATENT DOCUMENTS

| | | |
|---|---|---|
| CN | 1227439 A | 9/1999 |
| CN | 1350351 A | 5/2002 |

(Continued)

OTHER PUBLICATIONS

Roberts, D.K., et al., Aircraft high current switch module, GE Co-Pending Application No. 1700227.0, filed on Jan. 6, 2017.

(Continued)

*Primary Examiner* — James Wu
(74) *Attorney, Agent, or Firm* — McGarry Bair PC

(57) ABSTRACT

An apparatus for distributing power from a power source to a set of power outputs using a power distribution rack includes a manifold having a set of bus bars in a wall and coupling a power source to a set of electronic cards, wherein the electronic cards route the power from the power source to the power outputs.

20 Claims, 5 Drawing Sheets

(56) References Cited

U.S. PATENT DOCUMENTS

| | | | |
|---|---|---|---|
| 7,076,592 B1* | 7/2006 | Ykema | H05K 7/1457 700/286 |
| 9,561,760 B2 | 2/2017 | Shander et al. | |
| 9,912,193 B2 | 3/2018 | Grujovski et al. | |
| 2003/0016520 A1* | 1/2003 | Cooney | H05K 7/1449 361/826 |
| 2014/0247540 A1* | 9/2014 | Steeves | H05K 13/04 361/624 |
| 2016/0043555 A1 | 2/2016 | Howell | |
| 2017/0181310 A1 | 6/2017 | Deshayes | |
| 2018/0069383 A1* | 3/2018 | Brett | H05K 7/1457 |

FOREIGN PATENT DOCUMENTS

| | | |
|---|---|---|
| CN | 101521328 A | 9/2009 |
| CN | 101546875 A | 9/2009 |
| CN | 104554747 A | 4/2015 |
| CN | 105138100 A | 12/2015 |
| CN | 105281430 A | 1/2016 |
| EP | 0939459 A3 | 7/2001 |
| WO | 2015/124722 A1 | 8/2015 |
| WO | 2016/141999 A1 | 9/2016 |

OTHER PUBLICATIONS

Combined Search and Examination Report issued in connection with corresponding GB Application No. 1709313.9 dated Nov. 30, 2017.

Chinese Patent Office, Office Action re Chinese Patent Application No. 201810601126.2, dated Feb. 6, 2020, 9 pages, China.

\* cited by examiner

POWER DISTRIBUTION RACK ASSEMBLY

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations.

Typical power distribution nodes include one or more rack assemblies for including, for example, a number of electronic cards to provide for the aforementioned conversions or switching functions. The rack assemblies are not typically optimized to be contained within the smallest configurable installation volume, leading to rack assemblies larger than necessary, and unused or underutilized components.

BRIEF DESCRIPTION

In one aspect, the disclosure relates to a power distribution rack assembly including a manifold having a back wall and defining a set of slots within the manifold, the set of slots opposite the back wall, and the back wall including a communication backplane and a set of bus bar conductors extending along at least a portion of the back wall normal to the slots, at least one primary electronic module having a first power input connector, a first power output connector adapted to connect with the set of bus bar conductors, and a first communication backplane connector adapted to connect with the communications backplane, at least one secondary electronic module having a second power input connector adapted to connect with the set of bus bar conductors, a second power output connector adapted to connect with an electrical load, and a second communication backplane connector adapted to connect with the communications backplane. The at least one primary electronic module and the at least one second electronic module is configured to be selectively received in the set of slots.

In another aspect, the disclosure relates to a modular distribution rack assembly including a manifold having a set of slots adapted to receive a set of electronic cards, a set of bus bars disposed in a back wall of the manifold normal to the set of slots, a communication backplane disposed in the back wall of the manifold normal to the set of slots, wherein the communication backplane communicatively connects the set of electronic cards. The set of electronic cards can include at least one primary electronic module having a power input, at least one secondary electronic module having a power output, and a rack controller module configured to control the at least one primary electronic module and the at least one secondary electronic module. The set of bus bars are conductively connected with the at least one primary electronic module and the at least one secondary module. The at least one primary electronic module receives power at the power input and is configured to controllably provide the power to the set of bus bars, and the at least one secondary module receives the power from the set of bus bars and is configured to controllably provide the power to the power output.

DETAILED DESCRIPTION

Figure 1:
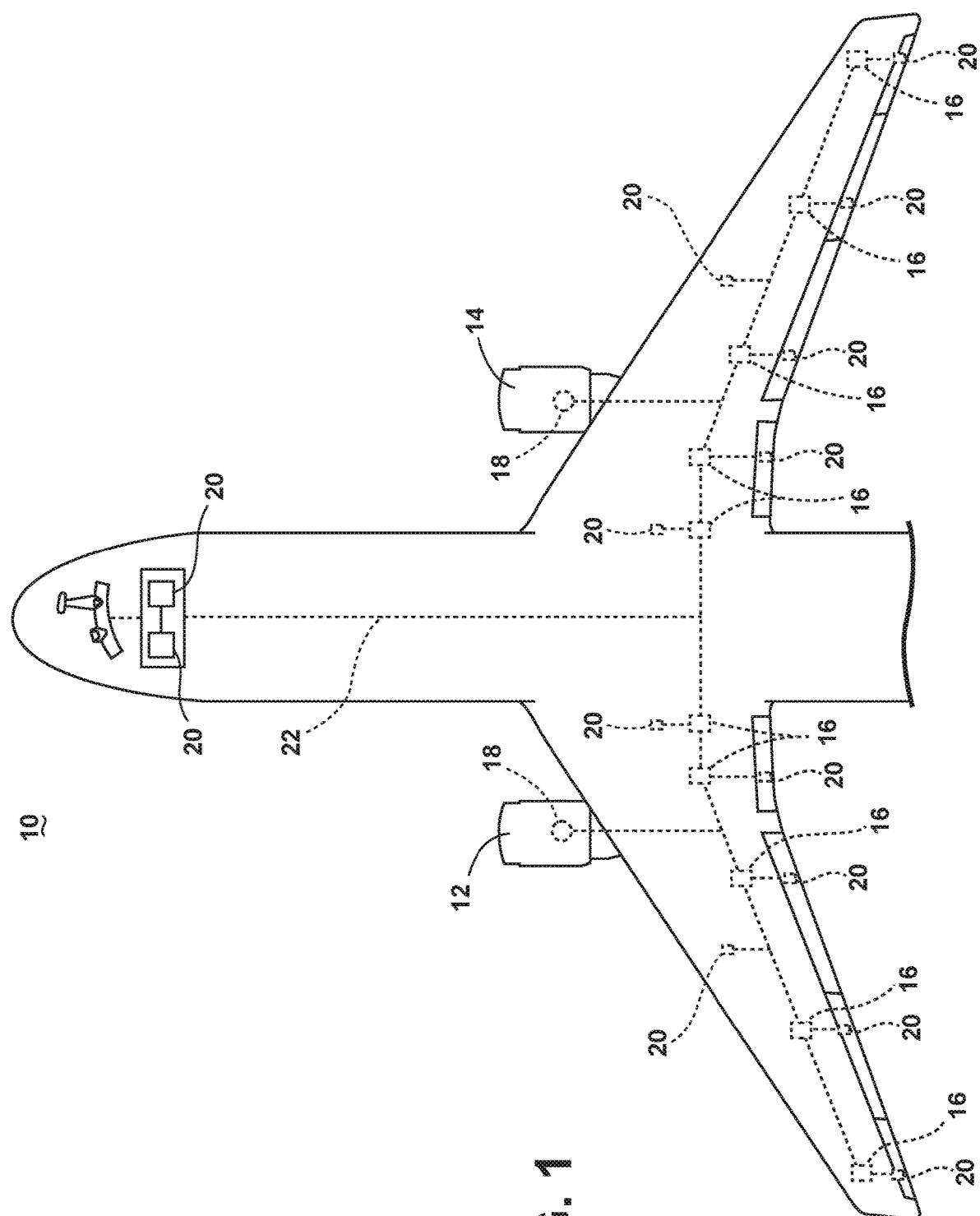
FIG. 1 is a top down schematic view of the aircraft and power distribution system of an aircraft in accordance with various aspects described herein.

The described aspects of the present disclosure are directed to a method and apparatus associated with a modular power distribution rack. One example environment where such a method and apparatus can be used includes, but is not limited to, a power distribution system for an aircraft. While this description is primarily directed toward a power distribution system for an aircraft, it is also applicable to any environment using a nodal-based power distribution system where input power is received, acted upon (if necessary), e.g., converted or modified, and distributed to one or more electrical loads.

While "a set of" various elements will be described, it will be understood that "a set" can include any number of the respective elements, including only one element. The use of the terms "proximal" or "proximally" refers to a component being relatively closer to another component or referential point. Additionally, while terms such as "voltage", "current", and "power" can be used herein, it will be evident to one skilled in the art that these terms can be interchangeable when describing aspects of the electrical circuit, or circuit operations.

All directional references (e.g., radial, axial, upper, lower, upward, downward, left, right, lateral, front, back, top, side, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other.

In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein.

The exemplary drawings are for purposes of illustration only and the dimensions, positions, order and relative sizes reflected in the drawings attached hereto can vary.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated aspect of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations. Additional power supplying or power generating components can be included in aspects of the disclosure, including but not limited to, auxiliary power units, batteries, fuel cells, or the like.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. Additional management functions can be included. Furthermore, additional power sources for providing power to the electrical loads 20, such as emergency power sources, ram air turbine systems, starter/generators, or batteries, can be included, and can substitute for the power source. It will be understood that while one aspect of the disclosure is shown in an aircraft environment, the disclosure is not so limited and has general application to electrical power systems in non-aircraft applications, such as other mobile applications and non-mobile industrial, commercial, and residential applications.

Figure 2:
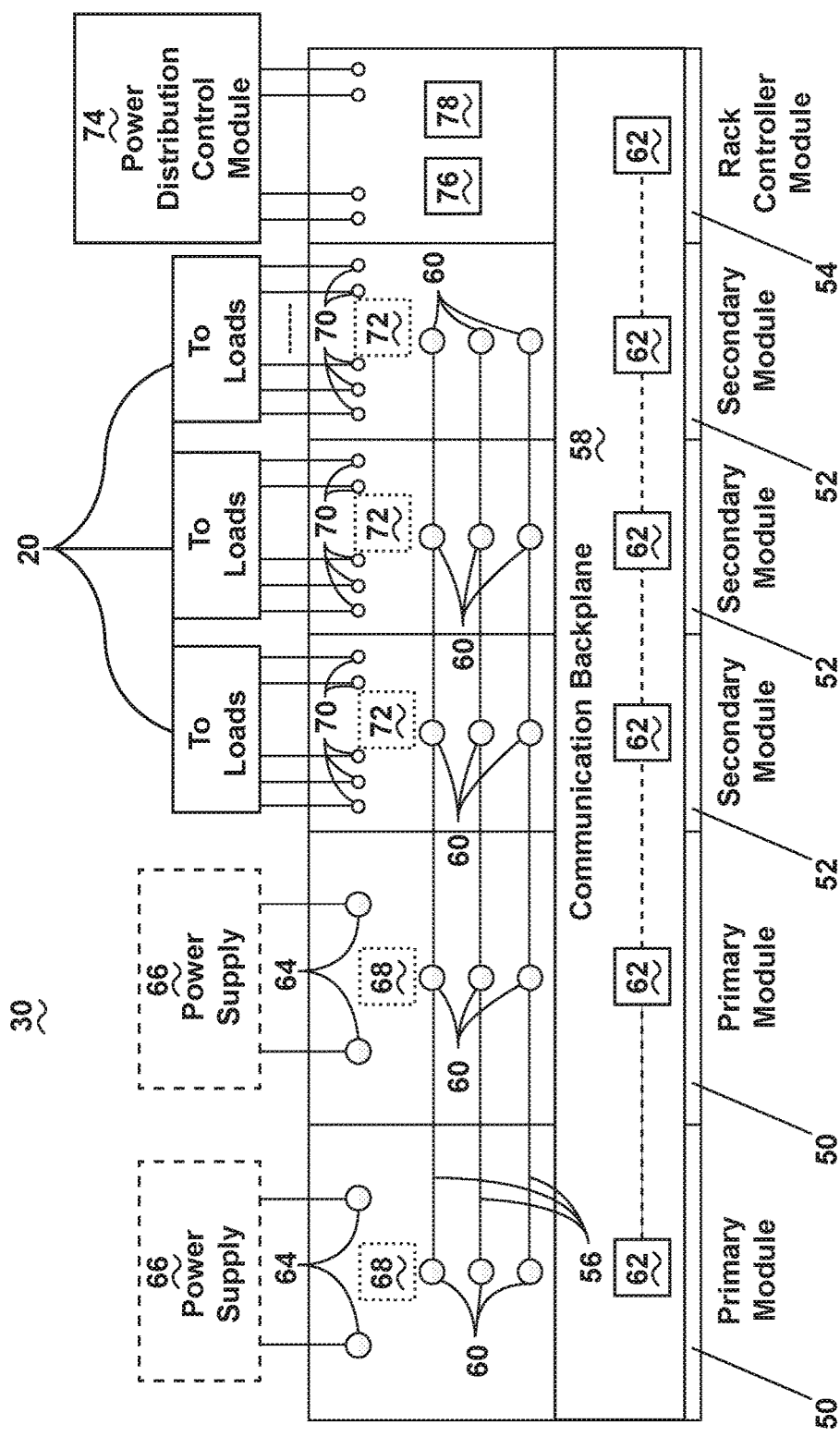
FIG. 2 is a schematic view of a power distribution rack assembly in accordance with various aspects described herein.

FIG. 2 illustrates an example schematic power distribution rack assembly 30, for ease of understanding. As shown, the power distribution rack assembly 30 can include at least one primary module 50, at least one secondary module 52, and at least one rack communication module 54. The at least one primary module 50, the at least one secondary module 52, and the at least one rack communication module 54 can be commonly connected to one another by way of a set of bus bars 56 that extends to the primary and secondary modules 50, 52 and a communication backplane 58 that extends to the respective modules 50, 52, 54. In this sense, at least the primary and secondary modules 50, 52 can have a corresponding set of bus bar connectors 60 adapted to connect with the set of bus bars 56. Additionally, the primary, secondary, and rack communication modules 50, 52, 54 can include respective communication backplanes connectors 62 adapted to communicatively connect with the communication backplane 58.

The primary modules 50 can further include at least one first power input connection 64 adapted to connect with a power supply 66, such as the generators 18, auxiliary power unit, battery, or the like. In one non-limiting aspect, the primary modules 50 are illustrated having two first power input connections 64, which for example, can provide or enable a redundant connection to a single power supply 66, or can provide or enable dual power supply 66 inputs to the primary module 50. In another non-limiting aspect of the disclosure, the primary module 50 can include a first set of power electronics 68 configured, selected, adapted, or arranged to enable power distribution from the power supply 66 to the set of bus bars 56. In this sense, the bus bar connectors 60 of the primary modules 50 can effectively operate as a first power output from the primary modules 50 to the set of bus bars 56.

For instance, in one non-limiting aspect of the disclosure, the first set of power electronics 68 can include at least one power converter, power inverter, solid state switching component, or the like, selected, configured, or the like, to provide the power received by the power supply 66 to the set of bus bars 56. In another non-limiting aspect, the first set of power electronics 68 can rectify an alternating current (AC) power received from the power supply 66 to one or more direct current (DC) power (e.g. plus or minus DC voltage) provided to the set of bus bars 56. In another non-limiting aspect, the first set of power electronics 68 can invert a DC power received from the power supply 66 to an AC power provided to the set of bus bars 56. In this sense, while a set of three bus bars 56 are shown, aspects of the disclosure can be included wherein the number of bus bars 56 are selected to match desired AC, DC, or combination thereof, power supply characteristics for the power distribution rack assembly 30.

Non-limiting examples of desired power supply characteristic can include two bus bars for DC power, three bus bars for three-phase AC power, four bus bars for three-phase and neutral AC power, or the like. Additionally, the power distribution rack assembly 30 can include a first set of bus bars configured to selectively convey AC power, and a second set of bus bars configured to selectively convey DC power, or to convey both powers simultaneously. One non-limiting aspect of the primary module 50 can be configured, enabled, or designed to receive 28 Volts of direct current (DC) power at 500 Amperes from the first power input connections 64, and, by way of the first set of power electronics 68, convert the power to 270 Volts DC power at 200 Amperes, which is supplied to at a subset of the bus bars 56.

The secondary modules 52 can include at least one second power output connector 70 selectively connected with a power-consuming destination, such as a set of electrical loads 20. While the secondary module 52 is illustrated as connected to a single electrical load 20 by way of a set of conductive connections, aspects of the disclosure can be included wherein a set of electrical loads 20 are connected with, selectively powered by, or selectively energized by a secondary module 52. In this sense, the secondary module 52 can include a second set of power electronics 72 configured to invert, rectify, or selectively energize, enable, or otherwise provide a power supply from the set of bus bars 56 to the second power output connector 70 or the electrical loads 20. Thus, the second set of power electronics 72 can be controllably operated to operate a switching element, in response to a control signal, to selectively energize the electrical loads 20 arranged to couple with the secondary module 52.

Non-limiting aspects of the disclosure can be included wherein the second set of power electronics 72 can include employing a solid state power controller (SSPC). One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included. In one non-limiting aspect of the secondary module 52, the module 52 can be configured, enabled, or designed to operably enable or energize the set of electrical loads 20, wherein each secondary module 52 can handle, for example, up to 50 Amperes of DC power.

In another non-limiting aspect of the disclosure, the control signal for operating or employing the second set of power electronics 72 can originate or be generated by the secondary module 52 or component thereof, or can be generated from another communicatively connected component, such as another component communicatively connected with the secondary module 52 by way of the communication backplane 58 or communication backplane connector 62.

Aspects of the disclosure can also be included wherein, for example, the rack controller module 54 is further communicatively connected with a power distribution controller module 74 configured to operate or enable at least an aspect of the power distribution system of the aircraft, including the power distribution rack assembly 30, or a processor 76 and memory 78 configured to operate or enable the supplying of power to the electrical loads 20 connected with the power distribution rack assembly 30. In this sense, the processor 76 or rack controller module 54 can be configured to run any suitable programs or executable instructions designed to operate the power distribution rack assembly 30, wherein the suitable programs or executable instructions are stored in the memory 78, or communicated from the power distribution controller module 74.

In one non-limiting aspect of the disclosure, the processor 76 or rack controller module 54 can operate, or can generate a set of control signals to operate, the set of primary modules 50, the set of secondary modules 52, or a combination thereof, to enable the selective powering or energizing of the electrical loads 20, in accordance with a power distribution system operation. The operating, or the generated control signals, can be communicated to the respective modules 50, 52, by way of the communication backplane 58 or the communication backplane connectors 62. While the set of bus bars 56 are not illustrated connecting with the rack controller module 54, non-limiting aspects of the rack controller module 54 can be included wherein at least a subset of bus bars 56 can be conductively connected with the module 54 by way of bus bar connectors 60, to energize or otherwise power the rack controller module operations or functionality.

Figure 3:
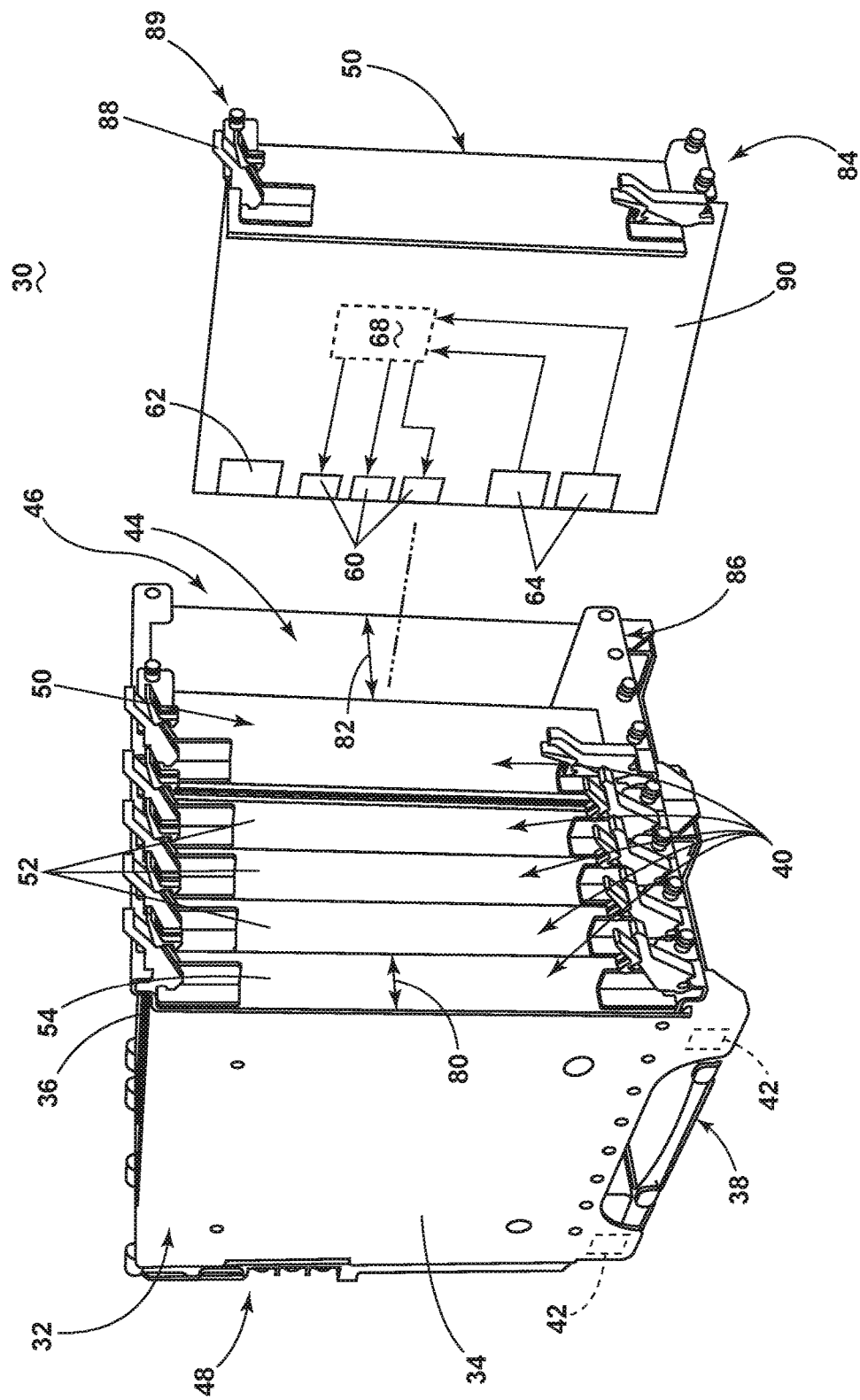
FIG. 3 is a front-facing isometric view of the power distribution rack assembly in accordance with various aspects described herein.

FIG. 3 illustrates an isometric view of one form of the power distribution rack assembly 30. The power distribution rack assembly 30 can include a manifold 32 having a box-like configuration, as shown, with opposing electrically non-conductive sidewalls 34, an electrically non-conductive top wall 36, and an electrically non-conductive bottom wall 38 opposite the top wall 36. The manifold can further define an open face front 46 and opposing electrically non-conductive back wall 48, spaced normally from, and connecting the opposing sidewalls 34 and opposing top wall 36 and bottom wall 38. Non-limiting aspects of the manifold 32 can further define a set of slots 44 within open face front 46 of the manifold 32, configured to receive and guide a set of electronic cards 40 to be installed within the manifold 32. The slots 44 can be defined by projections on one or more of the walls, such as the top and bottom walls 36, 38, such projections including but not limited to ribs, ridges, bosses, and the like. The slots 44 can be arranged such that a set of electronic cards 40 received in the slots 44 will be parallel with the opposing sidewalls 34. In FIG. 3, the electronic card 40 is shown positioned in parallel, with respect to other cards 40, and with respect to the sidewalls 34. As shown, one electronic card 40 partially received in a corresponding slot 44, for ease of understanding. Non-limiting aspects of the disclosure can be included wherein at least one of the manifold 32 or the set of slots 44 can be adapted, selected, or configured to receive a predetermined, preselected, or total number of the set of electronics cards 40. In this sense, the manifold 32 of the power distribution rack assembly 30 can be modularly configured to reduce space or volume to only that space or volume desired, required, designed, or the like.

While the set of electronics cards 40 are further positioned in parallel with respect to, and in between, the opposing sidewalls 34, aspects of the disclosure can include configurations where a subset of electronic cards 40 are configured in parallel, or wherein different subsets of the electric cards 40 are configured in different parallel configurations. Furthermore, while the rack assembly 30 is illustrated in a manifold 32, alternative manifold configurations (e.g. shapes, contours, profiles) are contemplated, and can be at least partially determined based on space limitation in the operating environment.

Additionally, while the above-described power distribution rack assembly 30 defines sidewalls 34, a top wall 36, a bottom wall 38, a back wall 48, and a front open face 46, it is understood that the walls 34, 36, 38, 48, face 46, or a combination thereof can be interchangeably defined based on the position, rotation, and placement of the power distribution rack assembly 30, itself. For example, while the top wall 36 is illustrated as the upright, horizontal upper wall in FIG. 3, a 90 degree clockwise rotation of the rack assembly 30, for instance, as necessary for mounting the power distribution rack assembly 30 in an aircraft, can result in the previously top wall 36 effectively aligned as a sidewall 34.

Thus, it will be understood references to one or more specific or particular "walls" are only with reference to the figures shown, and can be interchangeable in practice.

At least a set of the aforementioned walls 34, 36, 38, 48 can provide the structural rigidity needed for the power distribution rack assembly 30 to retain an intended shape, contour, or profile, as well as to support the set of electronic cards 40 and any necessary environmental consideration, including but not limited to, aircraft vibrations or forces applied to the power distribution rack assembly 30 during take-off and landing. For example, power distribution rack assembly 30 is shown having a mounting bracket 42, illustrated in dotted outline, for mounting at least a portion of the power distribution rack assembly 30 with another structure, such as an aircraft surface or wall. Any suitable mounting materials or mounting techniques can be utilized, and can include, but are not limited to, mechanical fasteners, screws, epoxy, adhesive, or force or tension mountings.

Furthermore, while the sidewalls 34 or bottom wall 38 has been described as electrically non-conductive, aspects of the disclosure can include walls 34, 36, 38, 48 machined or manufactured from electrically conductive materials, including but not limited to, aluminum, copper, and the like, to provide the required rigidity, and coated with a non-conductive paint, epoxy, or material to provide non-conductive qualities as may be necessary to preserve continuity in electrical components. In another non-limiting aspect of the disclosure, the walls 34, 36, 38, 48, mounting brackets 42, or a combination thereof can be formed from an at least partially electrically conductive material, for example, to provide an electrical grounding path for any electronics incorporated into the power distribution rack assembly 30. Moreover, while not germane to the disclosure, aspects of the power distribution rack assembly 30 can also include pores, perforations, or inlet/outlet combinations to provide for a coolant, such as air or liquid, to traverse the internal power distribution rack assembly 30, as suitable or needed for heat management design concerns.

As shown, the set of electronic cards 40, which, as illustrated, can include a set of primary modules 50, a set of secondary modules 52, or a combination thereof, can be received within the set of slots 44. The set of slots 44 can be configured or prearranged to include a slot width matching, keyed, or dimensioned to receive the corresponding electronic cards 40. For instance, in one non-limiting aspect, a first slot width 80 can be dimensioned or keyed to match a first electronic card 40, such as the secondary module 52. In another non-limiting aspect, a second slot width 82 can be dimensioned or keyed to match a second electronic card, such as the primary module 50. Aspects of the disclosure can be included wherein the first slot width 80 and second slot width 82 can be dimensioned relative to each other. For example, the first slot width 80 can be sized, shaped, contoured, or the like, with a first dimension, while the second slot width 82 can be sized, shaped, contoured, or the like, to be twice or double the first slot width 80. Any referential dimensioning can be included. In a corresponding understanding, aspects of the primary or secondary modules 50, 52 can likewise be dimensioned, sized, or contoured to match the respective slot widths 80, 82, or be dimensioned, sized, or contoured relative to each other. In one non-limiting aspect, the primary module 50 can be twice or double the width of a secondary module 52. Non-limiting aspects of sizing of the slots 44 or modules 50, 52 can be based on, for instance, volumetric requirements for the electrical components, inputs, outputs, or heating or cooling considerations.

The set of electronic cards 40 can also define mechanical connectors 84 keyed or located to correspond with mechanical interfaces 86 disposed on the manifold 32. In the aforementioned example, the mechanical connectors 84 can include, but are not limited to, a clip interface 88 or a fastener interface 89, such as a screw. Aspects of the disclosure can be included wherein the mechanical connectors 84 are permanently or removably connected with the corresponding mechanical interfaces 86 to hold, retain, restrain, or otherwise connect the electrical cards 40 within the slots 44 or within the manifold 32.

In one exemplary illustration, the removed primary module 50 demonstrates a non-limiting schematic form of operation described herein. As shown, the primary module 50 can include a substrate 90, such as a printed circuit board (PCB), defining an edge of the primary module 50. At least one edge of the substrate 90, shown as the rear edge, can include the communication backplane connector 62, the bus bar connectors 60, and the first power input connectors 64 described with respect to FIG. 2. The primary module 50 also schematically illustrates the first power electronics 68, receiving conductive connections (illustrated as arrows) from the first power input connections 64, and providing conductive connections (illustrated as arrows) to the set of bus bar connectors 60. The backplane connector 60 is also shown communicatively connected with the first power electronics 68, by way of a dotted communication line.

Figure 4:
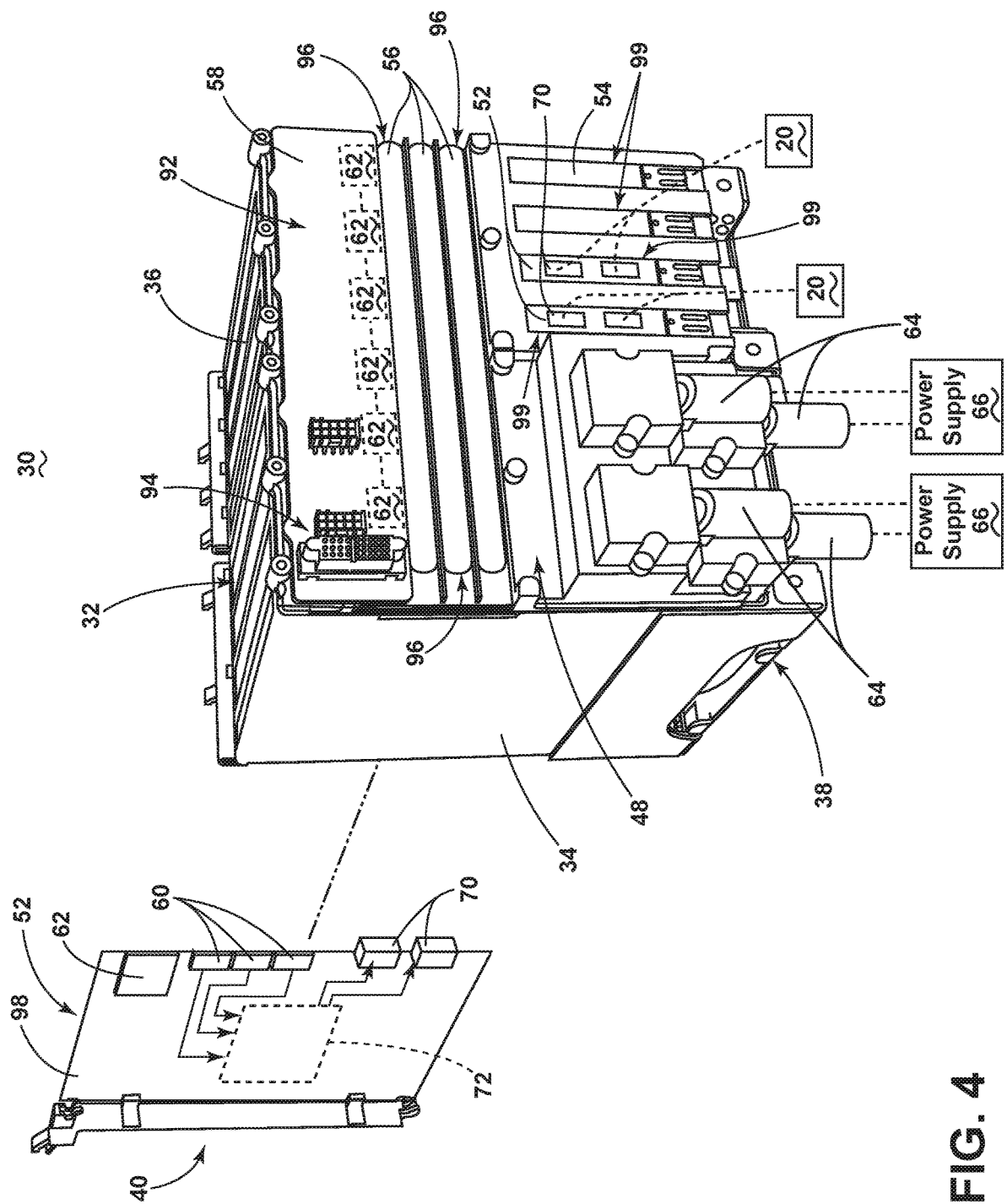
FIG. 4 is a rear-facing isometric view of the power distribution rack assembly in accordance with various aspects described herein.

FIG. 4 illustrates the power distribution rack assembly 30 from the isometric perspective viewing the back wall 48, that is, opposed from the isometric view of FIG. 3. As shown in FIG. 4, the back wall 48 can include the communication backplane 58 in the form of a substrate 92 or PCB that extends horizontally along at least a portion of the back wall 48 such that it can provide the backplane 58 or the communication backplane connector 62 for intra-rack communications between the set of electronic cards 40, the set of primary modules 50, the set of secondary modules 52, or a combination thereof. As illustrated, aspects of the communication backplane 58 can extend horizontally across the majority of the back wall 48, such that an electronics card 40 installed or received by each slot 44 can connect with the backplane 58, if desired. Also as shown, the power distribution rack assembly 30 or the communication backplane 58 can optionally include an external communication connector 94 configured to communicatively connect with an external control system, for example, the power distribution controller module 74 of FIG. 2, and described herein.

The power distribution rack assembly 30 can also include a set of channels 96 extending horizontally along at least a portion of the back wall 48, wherein the set of channels 96 are sized and configured to receive the set of bus bars 56. As illustrated, aspects of the set of channels 96 or set of bus bars 56 can extend horizontally across the majority of the back wall 48, such that an electronics card 40 installed or received by each slot 44 can connect with can connect with the set of channels 96 or set of bus bars 56, if desired. While three bus bars 56 and three corresponding channels 96 are illustrated, alternative numbers of channels 96, bus bars 56, or a combination thereof, can be included. In one non-limiting aspect of the disclosure, a nonconductive panel can be installed overlying the set of bus bars 56 or the set of channels 96 to prevent or reduce the risk of inadvertent electrical exposure to the power carried by the set of bus bars 56. In another non-limiting aspect of the disclosure, another nonconductive panel or the earlier-described nonconductive panel can be installed overlying the communication backplane 58 to prevent or reduce the risk of inadvertent contact with the communication backplane 58, or to protect the communication backplane 58.

In the example illustrated in FIG. 4, the partially removed electronics card 40 is shown in the form of a secondary module 52. As schematically shown, the secondary module 52 can include a substrate 98, such as a printed circuit board (PCB), defining an edge of the secondary module 52. At least one edge of the substrate 98, shown as the rear edge, can include the communication backplane connector 62, the bus bar connectors 60, and the second power output connector 70 described with respect to FIG. 2. The secondary module 52 also schematically illustrates the second power electronics 72, receiving conductive connections (illustrated as arrows) from the set of bus bar connectors 60, and providing conductive connections with the second power output connectors 70, illustrated as dual second power output connectors 70. The backplane connector 60 is also shown communicatively connected with the first power electronics 68, by way of a dotted communication line.

In another non-limiting aspect, the back wall 48 of the power distribution rack assembly 30 can further include a set of openings or apertures 99 arranged or disposed to provide access to at least one input or output of at least one electronic card 40. In one non-limiting aspect, the back wall 48 can include a set of apertures 99 arranged or disposed to provide access to the set of second power output connectors 70 for a corresponding set of secondary modules 52. As schematically illustrated, the set of second power output connectors 70 can further be connected with a set of electrical loads 20 via the set of apertures 99.

In yet another non-limiting aspect, the back wall 48 of the power distribution rack assembly 30 can also include a set of power input connectors, such as the first power input connectors 64, arranged, disposed, or aligned with slots 44 holding at least one primary module 50. As schematically illustrated, the set of first power input connections 64 can be connected with at least one power supply 66, as described herein.

Figure 5:
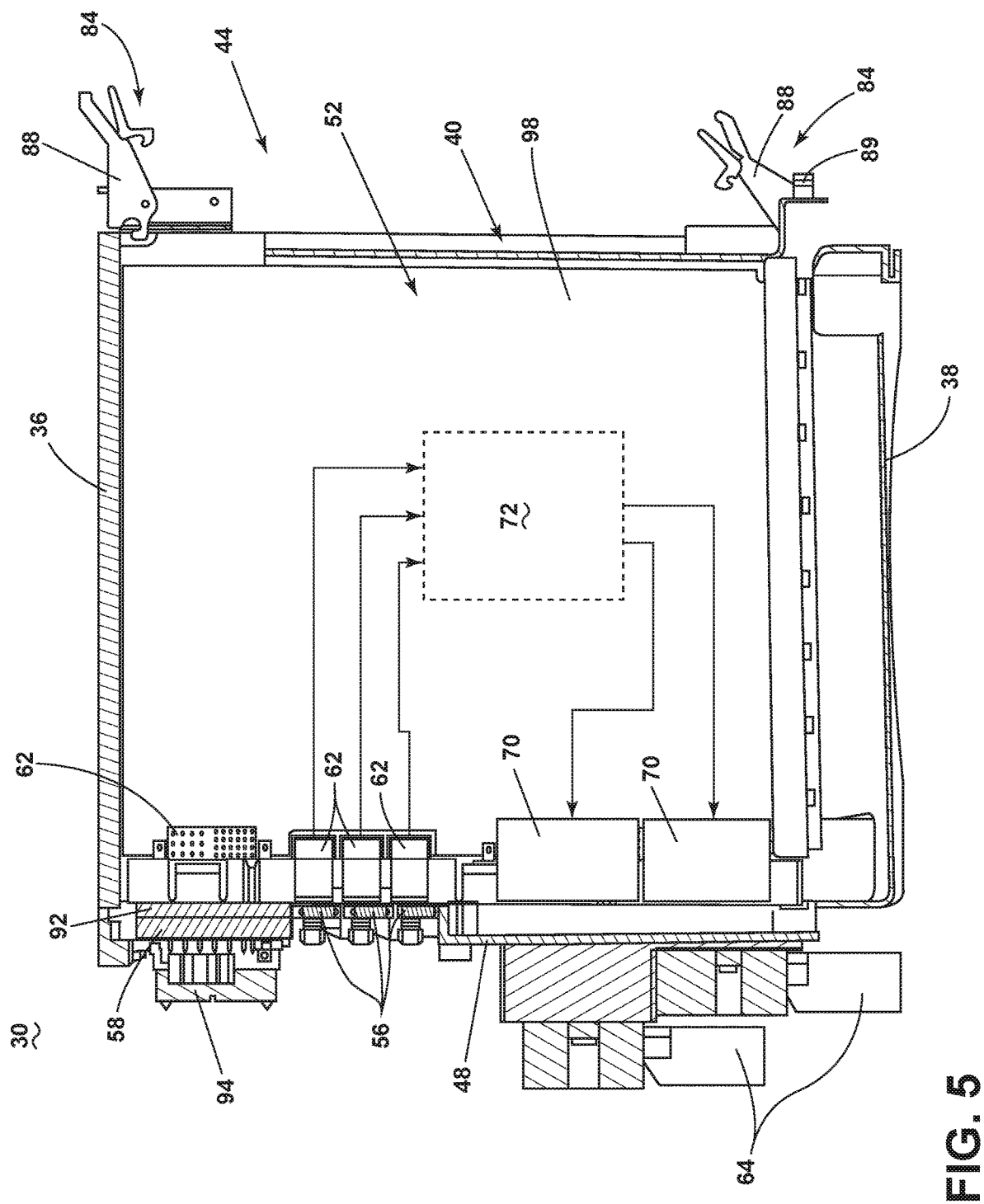
FIG. 5 is a cross-sectional view of an electronic card received within the power distribution rack assembly in accordance with various aspects described herein.

FIG. 5 illustrates a cross-sectional view of the power distribution rack assembly 30, showing a secondary module 52 received into a respective slot 44, and connecting with the components incorporated with the back wall 48 of the manifold 32. As shown, the communications backplane connector 62 is communicatively connected with the communication backplane 58, at least a subset of the bus bar connectors 60 are conductively connected with the set of bus bars 56, and the set of second power output connectors 70 extend through the aperture 98 of the back wall 48. While the secondary module 52 is illustrated, similar connections with components incorporated into the manifold 32, the power distribution rack assembly 30, or the back wall 48 can be connected with the primary module 50, as described herein.

Non-limiting aspects of the disclosure can be included wherein at least one of the back wall 48, the set of channels 96, the set of bus bars 56, or the set of bus bar connectors 60 are configured or arranged to conductively connect with a subset of the bus bars 56. For instance, certain electronic cards 40 can be connected with selected bus bars 56 for power loading or power sharing considerations. In another non-limiting aspect, one or more conductive connections between a subset of bus bars 56 and a corresponding subset of bus bar connectors 60 can be effectively, operably, or selectively disabled by an executable program, permanently or temporarily disabling supplying power from that bus bar 56 to the electronic card 40.

In another non-limiting aspect of the disclosure, in addition to, or in the alternative of varying set or number of bus bar 56, at least a subset of the bus bars 56 can have varying lengths along the horizontal extension. For instance, a first bus bar 56 can have a shorter horizontal span length than a second bus bar 56. Aspects of the disclosure can be included wherein the number, lengths, and arrangement of the set of bus bars 56 is fully configurable and selectable for arranging or enabling a modular power distribution rack assembly 30.

The bus bar connectors 60, communication backplane connectors 62, or the like can further be configured to include the any mechanical, electrical, or communicative connection, including, but not limited to, spring clips, ports, common interface connectors, or the like. In another non-limiting aspect of the disclosure, at least one of the electronic cards 40, the primary module 50, the secondary module 52, the first power input connections 64, the second power output connectors 70, or a combination thereof, can be positioned, configured, or otherwise selected to enable the respective component to extend through the corresponding set of apertures 98 or back wall 48, as described herein. It will be understood that a set of apertures 98 in the back wall 48 can be alternatively configured or arranged as a single elongated aperture 98 extending over part or most of the back wall 48.

Many other possible embodiments and configurations in addition to that shown in the above figures are contemplated by the present disclosure.

The selectability and configurability of the aspects described herein can define a modular power distribution rack assembly 30 for distributing power from a power source (such as the generator 18) to a set of power output connectors 70 or at least one electrical load 20. For example, a known set of electrical loads 20 in a portion of an aircraft 10 can define a predetermined or desired set of electrical outputs 70. Knowing the desired electrical outputs 70 and a set of power supplied by the power source, a set of electronic cards 40 can be selected to modify the power supplied by the power source to the desired electrical outputs 70. In one non-limiting aspect, the power supplied can be received by a set of primary modules 50 configured to receive the power, convert or modify the power as needed, and supply to power to a set of bus bars 56 incorporated in the power distribution rack assembly 30. A set of secondary modules 52 can be conductively connected with the set of bus bars 56 of the rack assembly 30, and receive power supplied thereto. The secondary modules 52 can then operably, effectively, or operably control the energizing of the set of electrical loads connected to the power distribution rack assembly 30. In this sense, the electronic cards 40 are selectable or modular based at least in part on the power supplied and the desired electrical output 70, power handling capabilities, redundancy, criticality of electrical load, or a combination thereof.

Moreover, the arrangement of the set of electronic cards 40, the back wall 48, the set of bus bars 56, and the power supplied by the power source 66, can be further customized for a particular desired power distribution rack assembly 30. Utilizing the modular components described herein, a power distribution node 16 or power distribution rack assembly 30 can be selectively configured or arranged to include a set of electronic cards 40 for modifying or routing known or predetermined power from a power source to a power output desired for a known or predetermined set of electrical outputs 70 or loads 20.

Many other possible aspects and configurations in addition to that shown in the above figures are contemplated by the present disclosure. For example, one aspect contemplates a rack assembly 30 with a top wall having a set of openings corresponding to the power output connectors 70, communication backplane 58, set of bus bars 56, or the like, of the respective electronic card 40. In this aspect, the openings of the rear wall can be keyed to a selected or specific at least one power output connector 70 or electronic card 40. In another example, the power distribution rack assembly 30 itself can be selectable based on a desired configuration, as explained above. For instance, a power distribution node 16 that only requires three electronic cards 40 can select a rack assembly having exactly three slots 44 to minimize installation volume in the aircraft 10. Additionally, the design and placement of the various components can be rearranged such that a number of different in-line configurations could be realized.

The aspects disclosed herein provide an apparatus for a power distribution rack assembly for distributing power from a power source to a set of power output connections or electrical loads by utilizing a series of configurable components to tailor or customize the power rack assembly for a particular need or desired power distribution node. One advantage that can be realized in the above aspects is that the tailoring to the particularized power distribution needs can reduce the number of unnecessary components included in the distribution node. Furthermore, the rack assembly itself can be selected to only provide a limited number of slots tailored to the expected number of electronic cards required for particular node operations. By reducing the number of components and reducing the total installation package volume, the above-described aspects of the disclosure have superior weight and size advantages over the conventional power distribution systems.

Another advantage to the above-described aspects is that by reducing the number of unnecessary components can reduce the cost for the power distribution rack assembly or node. Moreover, a decreased number of parts as the system will make the distribution system, rack assembly, or node inherently more reliable. Yet another advantage to the above-described aspects is that the smaller installation volume of the rack assembly can allow for the installation of the assembly closer to the electrical loads being serviced by the node. This closer proximity results in a reduction of interconnecting wire lengths with the assembly output, and hence a corresponding weight reduction due to wiring.

When designing aircraft components, important factors to address are size, weight, and reliability. The above described power distribution rack results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Moreover, while "a set of" various elements have been described, it will be understood that "a set" may include any number of the respective elements, including only one element. All combinations or permutations of features described herein are covered by this disclosure.

This written description uses examples to describe the disclosure, including the best mode, and also to enable any person skilled in the art to practice the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power distribution rack assembly comprising:
a manifold having a back wall and defining a set of slots within the manifold, the set of slots opposite the back wall, and the back wall including a communication backplane and a set of bus bar conductors extending along at least a portion of the back wall normal to the slots;
at least one primary electronic module having a first power input connector, a first power output connector connects with the set of bus bar conductors and provides power to the busbar conductors, and a first communication backplane connector connects with the communications backplane; and
at least one secondary electronic module having a second power input connector connects with the set of bus bar conductors and receives power from the bus bar conductors, a second power output connector adapted to connect with an electrical load, and a second communication backplane connector connects with the communications backplane;
wherein the at least one primary electronic module and the at least one second electronic module are selectively received in the set of slots.

2. The power distribution rack assembly of claim 1, wherein the first power input connector connects with a power supply.

3. The power distribution rack assembly of claim 2, wherein the at least one primary electronic module includes at least one power electronics element serially disposed between the first power input connector and the first power output connector.

4. The power distribution rack assembly of claim 3, wherein the at least one power electronics element converts a first power received at the first power input connector to a second power provided to the first power output connector.

5. The power distribution rack assembly of claim 1, wherein the communication backplane includes a printed circuit board that extends along at least a portion of the back wall.

6. The power distribution rack assembly of claim 5, wherein the printed circuit board extends at least along the set of slots.

7. The power distribution rack assembly of claim 5, wherein the printed circuit board includes a set of connectors that mates with at least one of the first communication backplane connectors or the second communication backplane connectors.

8. The power distribution rack assembly of claim 7, wherein the printed circuit board is connected with each of the at least one primary electronic modules and the at least one secondary electronic modules.

9. The power distribution rack assembly of claim 1, further comprising at least one rack controller module having a third communication backplane connector that connects with the communications backplane.

10. The power distribution rack assembly of claim 9, wherein the rack controller module is received in at least one of the set of slots.

11. The power distribution rack assembly of claim 9, wherein the rack controller module controls at least one of the primary electronic modules or the secondary electronic modules.

12. The power distribution rack assembly of claim 11, wherein at least one of the rack controller module and the communications backplane is communicatively connected with a power distribution control module of an aircraft, and controls at least one of the primary electronic modules or the secondary electronic modules in response to communications received by the power distribution control module.

13. The power distribution rack assembly of claim 1, wherein the at least one secondary electronic module includes at least one switchable element serially disposed between the second power input connector and the second power output connector, and selectively energizes the second power output connector.

14. The power distribution rack assembly of claim 13, wherein the at least one switchable element is a solid state power controller.

15. The power distribution rack assembly of claim 13, wherein the at least one switchable element is communicatively connected with the second communication backplane connector and is operates in response to communications carried by the communication backplane.

16. The power distribution rack assembly of claim 1, wherein a subset of the bus bars receives one of alternating current power or direct current power from the first power output connector.

17. The power distribution rack assembly of claim 1, wherein the first power input connector, the first power output connector, and the first communication backplane connector is on an edge of the at least one primary electronic module.

18. A modular distribution rack assembly comprising:
a manifold having a set of slots to receive a set of electronic cards, the set of electronic cards comprising:
at least one primary electronic module having a power input;
at least one secondary electronic module having a power output; and
a rack controller module to control the at least one primary electronic module and the at least one secondary electronic module; and
a set of bus bars disposed in a back wall of the manifold normal to the set of slots, wherein the set of bus bars are conductively connected with the at least one primary electronic module and the at least one secondary module; and
a communication backplane disposed in the back wall of the manifold normal to the set of slots, wherein the communication backplane communicatively connects the set of electronic cards;
wherein the at least one primary electronic module receives power at the power input and controllably provides the power to the set of bus bars, and wherein the at least one secondary module receives the power from the set of bus bars and controllably provides the power to the power output.

19. The modular distribution rack assembly of claim 18, wherein the set of slots of the manifold equals the total number of the set of electronic cards.

20. The modular distribution rack assembly of claim 18, wherein the rack controller module generates a set of control signals for the at least one primary electronic module and the at least one secondary electronic module, and provides the set of control signals to the communication backplane.

* * * * *